United States Patent
Furukawa et al.

(10) Patent No.: US 6,766,392 B2
(45) Date of Patent: Jul. 20, 2004

(54) ELECTRONIC APPARATUS, CONTROL CIRCUIT FOR ELECTRONIC APPARATUS, AND METHOD OF CONTROLLING ELECTRONIC APPARATUS

(75) Inventors: Hajime Furukawa, Kawasaki (JP); Masanori Kondoh, Sapporo (JP); Takeshi Suzuki, Inagi (JP)

(73) Assignee: Fujitsu Limited, Kawasaki (JP)

( * ) Notice: Subject to any disclaimer, the term of this patent is extended or adjusted under 35 U.S.C. 154(b) by 299 days.

(21) Appl. No.: 09/815,014

(22) Filed: Mar. 23, 2001

(65) Prior Publication Data

US 2001/0014952 A1 Aug. 16, 2001

Related U.S. Application Data (63) Continuation of application No. PCT/JP99/01838, filed on Apr. 7, 1999.

(30) Foreign Application Priority Data

Oct. 27, 1998 (JP) .......................................... 10-305889

(51) Int. Cl.⁷ .............................. G06F 3/12; G06F 1/32
(52) U.S. Cl. ............................. 710/67; 710/65; 710/73; 713/323
(58) Field of Search ........................... 710/5, 6, 18, 58, 710/59, 260, 261, 67, 65, 73; 713/320, 323

(56) References Cited

U.S. PATENT DOCUMENTS

| | | | |
|---|---|---|---|
| 5,307,488 A | * | 4/1994 | Nakai ........................... 710/260 |
| 5,530,879 A | * | 6/1996 | Crump et al. ............... 713/323 |
| 5,629,694 A | * | 5/1997 | Simon et al. ............... 713/323 |
| 6,223,294 B1 | | 4/2001 | Kondoh ....................... 713/310 |

FOREIGN PATENT DOCUMENTS

| | | |
|---|---|---|
| JP | 05241690 A | 9/1993 |
| JP | 7-44285 | 2/1995 |
| JP | 7-319590 | 12/1995 |
| JP | 08016336 A | 1/1996 |

OTHER PUBLICATIONS

*Advanced Configuration and Power Interface Specification* (Intel Microsoft Toshiba revision 1.0a); Jul. 1, 1988, pp. 24–35, 43–84 and 197–210.

* cited by examiner

Primary Examiner—Kim Huynh
(74) Attorney, Agent, or Firm—Westerman, Hattori, Daniels & Adrian, LLP (57) ABSTRACT

The present invention relates to an electronic apparatus, a control circuit of an electronic apparatus, and a method of controlling an electronic apparatus that change different states by a predetermined input operation, and has an object of providing an electronic apparatus, a control circuit of an electronic apparatus, and a method of controlling an electronic apparatus that prevent the transition of states due to an unintentional operation. A SUSPEND/RESUME signal generation part 151 for generating a SUSPEND/RESUME signal whose level becomes LOW when a SUSPEND/RESUME button 110 is pressed and a SUSPEND/RESUME signal control part 152 for maintaining the LOW-level period of the SUSPEND/RESUME signal generated by the SUSPEND/RESUME signal generation part 151 within a predetermined period T0 are provided between the SUSPEND/RESUME button 110 and a chip set 139 that achieves a SUSPEND or RESUME function when the SUSPEND/RESUME button 110 is pressed.

14 Claims, 9 Drawing Sheets

ELECTRONIC APPARATUS, CONTROL CIRCUIT FOR ELECTRONIC APPARATUS, AND METHOD OF CONTROLLING ELECTRONIC APPARATUS

This application is a continuation of international application PCT/JP99/01838, filed on Apr. 7, 1999.

TECHNICAL FIELD

The present invention relates to electronic apparatuses, control circuits for electronic apparatuses, and methods of controlling electronic apparatuses, and more particularly to an electronic apparatus, a control circuit for an electronic apparatus, and a method of controlling an electronic apparatus that change different states by a predetermined input operation.

Recently, a SUSPEND/RESUME function has been applied to an electronic apparatus such as a personal computer as a part of power management.

The SUSPEND/RESUME function is a sort of power-saving function of a personal computer. According to the SUSPEND/RESUME function, the system of a personal computer is caused to stop an operation of a hard disk or a CPU by operating a SUSPEND/RESUME button so as to change the state of the personal computer to a low power consumption state, and is caused to resume the operation of the hard disk or the CPU by operating the SUSPEND/RESUME button again.

A standard called ACPI (Advanced Configuration and Power Management Interface) is established for the power management of a power-saving function such as this SUSPEND/RESUME function of a personal computer. The power management of a personal computer is usually based on the ACPI standard.

Under the ACPI standard, it is required to have a function enabling a shut-off of power other than the SUSPEND/RESUME function.

BACKGROUND ART

Some chip sets house power management functions conforming to the ACPI standard so that the power management function conforming to the ACPI standard can be easily mounted.

Figure 1:
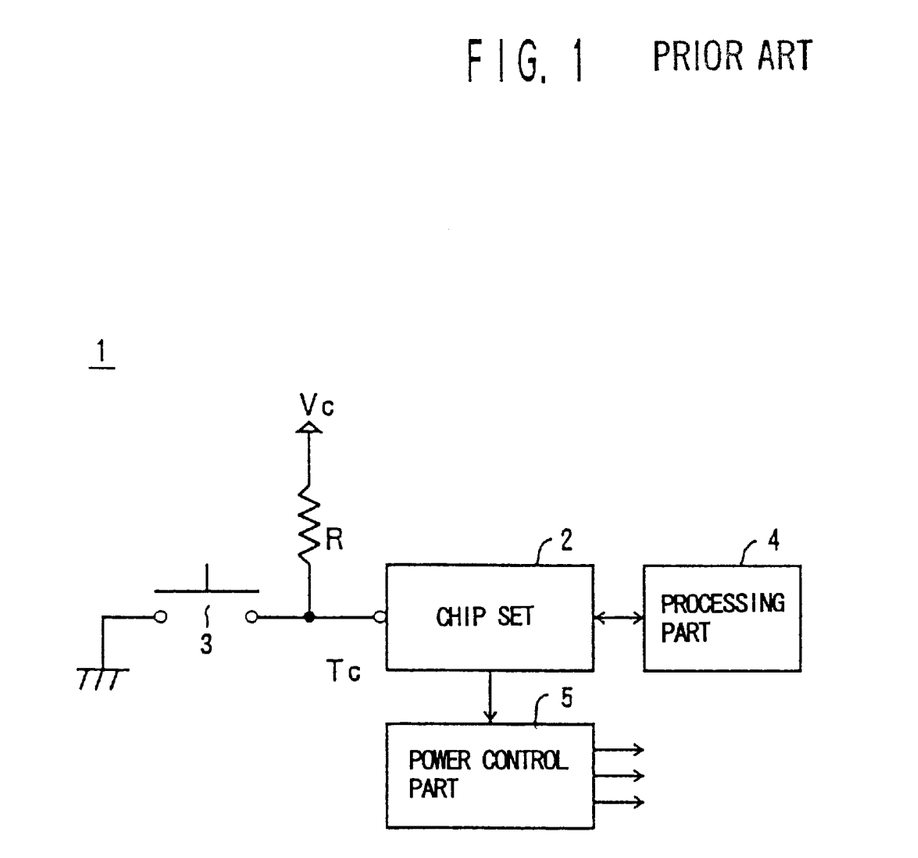
FIG. 1 is a block diagram of a conventional electronic apparatus.

FIG. 1 is a block diagram of a conventional electronic apparatus.

A conventional electronic apparatus 1 includes a chip set 2 connected to a SUSPEND/RESUME button 3. The chip set 2 causes an interrupt for a SUSPEND or RESUME operation to a processing part 4 based on an operation of the SUSPEND/RESUME button 3. After performing an operation such as a save of data in process in accordance with the interrupt for a SUSPEND or RESUME operation caused by the chip set 2, the processing part 4 controls a power control part 5 connected to the chip set 2 via the chip set 2 to stop a hard disk or a CPU so that power is supplied to a minimum essential part such as a part for data retention.

The SUSPEND/RESUME button 3 has its one end grounded and the other end connected to the chip set 2. A constant voltage Vc is applied via a resistor R between the SUSPEND/RESUME button 3 and the chip set 2.

If the SUSPEND/RESUME button 3 is switched OFF, the constant voltage Vc is applied to the chip set 2 via the resistor R. Therefore, a SUSPEND/RESUME control terminal Tc of the chip set 2, to which terminal the SUSPEND/RESUME button 3 is connected, is set to a HIGH level.

If the SUSPEND/RESUME button 3 is switched ON, the constant voltage Vc is applied to a ground through the resistor R and the SUSPEND/RESUME button 3. Therefore, the SUSPEND/RESUME control terminal Tc of the chip set 2, to which terminal the SUSPEND/RESUME button 3 is connected, is set to a LOW level.

The chip set 2 monitors a change in the level of the SUSPEND/RESUME terminal Tc. If the level of the SUSPEND/RESUME terminal Tc changes from the HIGH level to the LOW level while the processing part 4 is in a normal operating state, the chip set 2 causes an interrupt for a SUSPEND operation to the processing part 4. When the chip set 2 causes the interrupt for the SUSPEND operation to the processing part 4, the processing part 4 controls operations to be set in a SUSPEND state after saving the data in process.

If the level of the SUSPEND/RESUME terminal Tc changes again from the HIGH level to the LOW level while the processing part 4 is in the SUSPEND state, the chip set 2 causes an interrupt for a RESUME operation to the processing part 4. When the chip set 2 causes the interrupt for the RESUME operation to the processing part 4, the processing part 4 returns the saved data to return to the normal operating state.

Further, the chip set 2 is provided with a function enabling a shut-off of power by the operation of the SUSPEND/RESUME button 3. The chip set 2 monitors the level change of the SUSPEND/RESUME control terminal Tc. If the level of the SUSPEND/RESUME control terminal Tc is maintained at the LOW level, that is, the SUSPEND/RESUME button 3 is maintained in a pressed state, for a predetermined period of time, for instance, four seconds, the chip set 2 directly controls the power control part 5 to shut off the power irrespective of the states of the processing part 4.

Figure 2:
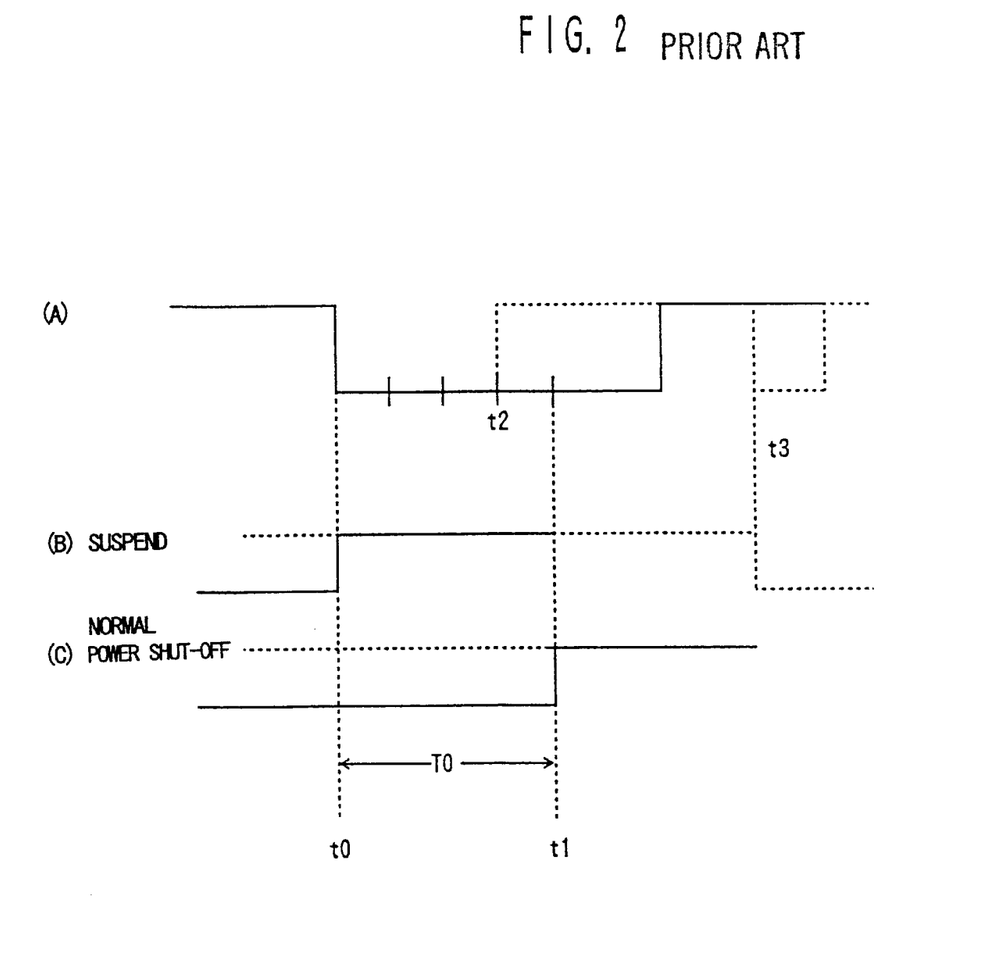
FIG. 2 is a waveform chart of an operation of the conventional electronic apparatus.

FIG. 2 is a waveform chart of an operation of the conventional electronic apparatus. FIG. 2(A) shows a signal supplied to the SUSPEND/RESUME control terminal Tc of the chip set 2 by the operation of the SUSPEND/RESUME button 3, FIG. 2(B) shows the SUSPEND state, and FIG. 2(C) shows a POWER SHUT-OFF state.

If the SUSPEND/RESUME button 3 is operated at a time t0, the SUSPEND/RESUME control terminal Tc of the chip set 2 changes from the high level to the low level as shown in FIG. 2(A).

When detecting the level change of the SUSPEND/RESUME control terminal Tc from the HIGH level to the LOW level, the chip set 2 causes an interrupt for the SUSPEND operation to the processing part 4. When interrupted by the chip set 2, the processing part 4 returnably saves data in process, and then controls the power control part 5 via the chip set 2 so as to shut off the power supply to a predetermined part. Thus, the processing part 4 is set in the SUSPEND state as shown in FIG. 2(B).

Further, the chip set 2 houses a timer. When the level change of the SUSPEND/RESUME control terminal Tc from the HIGH level to the LOW level is detected, the timer housed in the chip set 2 is activated to count time while the SUSPEND/RESUME button 3 is in the pressed state, that is, while the SUSPEND/RESUME control terminal Tc of the chip set 2 is maintained at the LOW level as indicated by a solid line in FIG. 2(A). When the timer counts time until a time t1 at which a predetermined period T0, for instance, four seconds, passes, the chip set 2 controls the power control part 5 to command a so-called POWER SHUT-OFF operation that shuts off all the power.

If pressing the SUSPEND/RESUME button 3 ends at a time t2 at which the predetermined period T0, for instance, four seconds, does not pass while the timer counts time, the chip set 2 maintains the system of the processing part 4 in the SUSPEND state.

Next, if the SUSPEND/RESUME button 3 is pressed at a time t3 so that the level of the SUSPEND/RESUME control terminal Tc of the chip set 2 changes again from the HIGH level to the LOW level as indicated by a broken line in FIG. 2(A), the chip set 2 causes an interrupt for the RESUME operation to the processing part 4. The processing part 4, based on the interrupt for the RESUME operation, controls the power control part 5 via the chip set 2 to turn on the power, and by returning the data saved at the time of the SUSPEND state, enables a processing operation to be resumed from a state before the SUSPEND state.

As described above, the chip set 2 houses a function performing the SUSPEND or RESUME operation, or the POWER SHUT-OFF operation depending on a pressing time of the SUSPEND/RESUME button 3.

However, in the POWER SHUT-OFF operation employing the conventional SUSPEND/RESUME button 3, the power is shut off by pressing the SUSPEND/RESUME button 3 for the predetermined period (four seconds). On the other hand, in the SUSPEND or RESUME operation by pressing the SUSPEND/RESUME button 3, it takes time in saving or returning data so that the SUSPEND or RESUME state is prevented from being set immediately after the operation of the SUSPEND/RESUME button 3. Therefore, in starting the SUSPEND or RESUME operation, the SUSPEND/RESUME button 3 is prone to be pressed for a longer period than necessary.

Therefore, if a user keeps pressing the SUSPEND/RESUME button 3 for a longer period than necessary in starting the SUSPEND or RESUME operation since it takes time in activating the SUSPEND/RESUME function, the power is shut off to erase the data in process, thus causing a problem.

The present invention is made in the light of the above-described point, and has an object of providing an electronic apparatus, a control circuit for an electronic apparatus, and a method of controlling an electronic apparatus which can prevent the transition of states due to an unintentional operation.

DISCLOSURE OF THE INVENTION

The present invention, which is an electronic apparatus changing states thereof based on a predetermined input operation, is characterized by including: input means for performing the predetermined input operation; input operation detection means for detecting a presence or absence of the predetermined input operation to the input means; state transition control means for changing a state of the apparatus from a first state to a second state when the input operation detection means detects an operation of the input means, and changing the state of the apparatus to a third state when a continuation of the operation of the input means for a predetermined period or longer is detected, the first, second, and third states being different from one another; and nullification means for nullifying the operation of the input means before a passage of the predetermined period.

Further, the present invention is characterized in that the input operation detection means includes detection signal generation means for generating a detection signal of a certain state based on the operation of the input means, and that the nullification means includes detection signal restriction means for restricting a period of the certain state of the detection signal within the predetermined period.

According to the present invention, by restricting the period of the predetermined input operation by the input means within the predetermined period, the state of the apparatus is prevented from being changed from the first state to the second state even if the input means is operated for the predetermined period or longer. Therefore, an unnecessary state transition can be prevented, thus increasing the operability of the electronic apparatus.

BEST MODE FOR CARRYING OUT THE INVENTION

Figure 3:
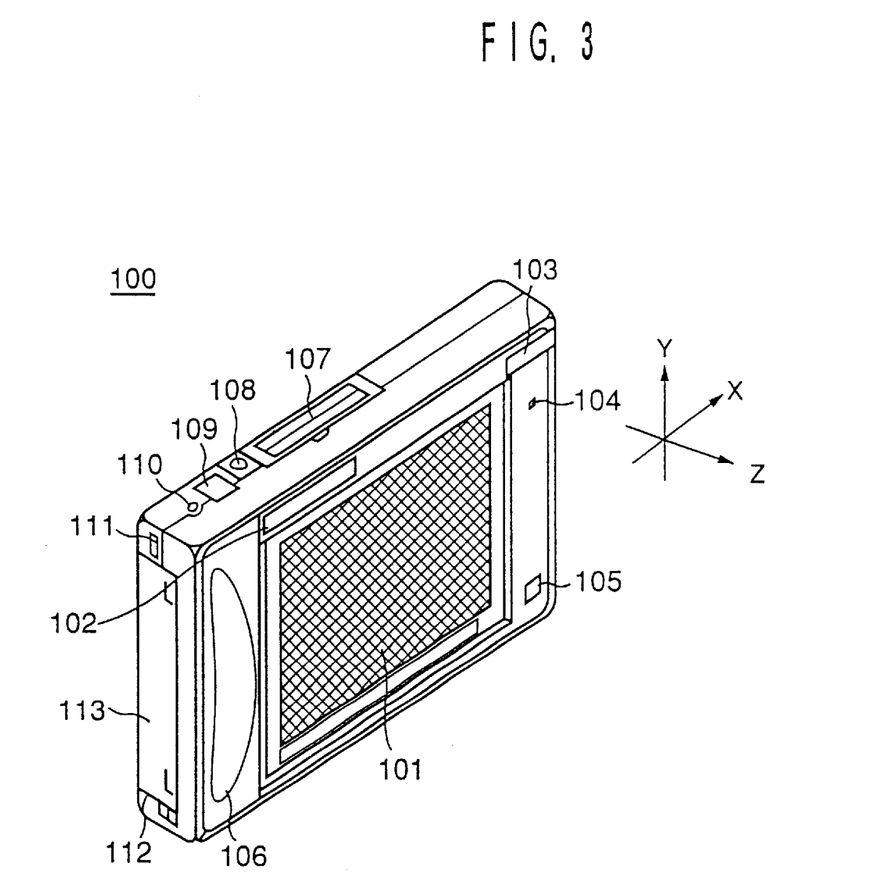
FIG. 3 is a perspective view of a display surface of an embodiment of the present invention.
Figure 4:
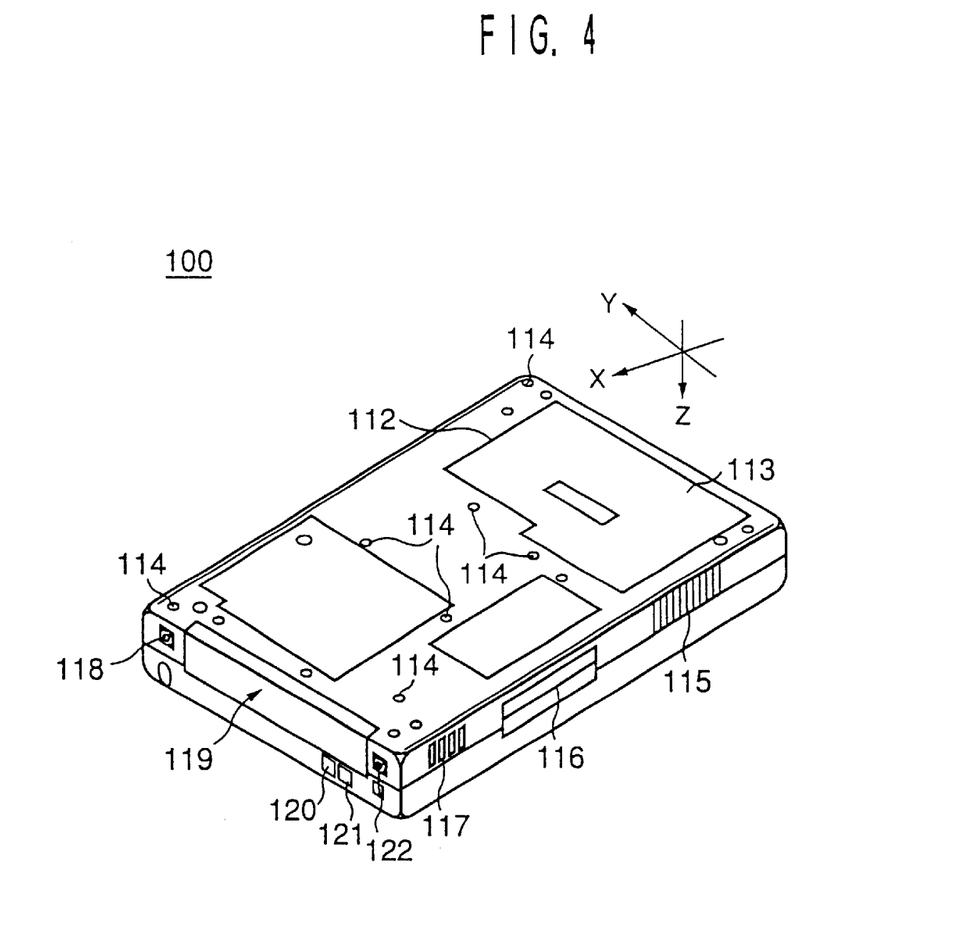
FIG. 4 is a perspective view of a reverse side of the embodiment of the present invention.
Figure 5:
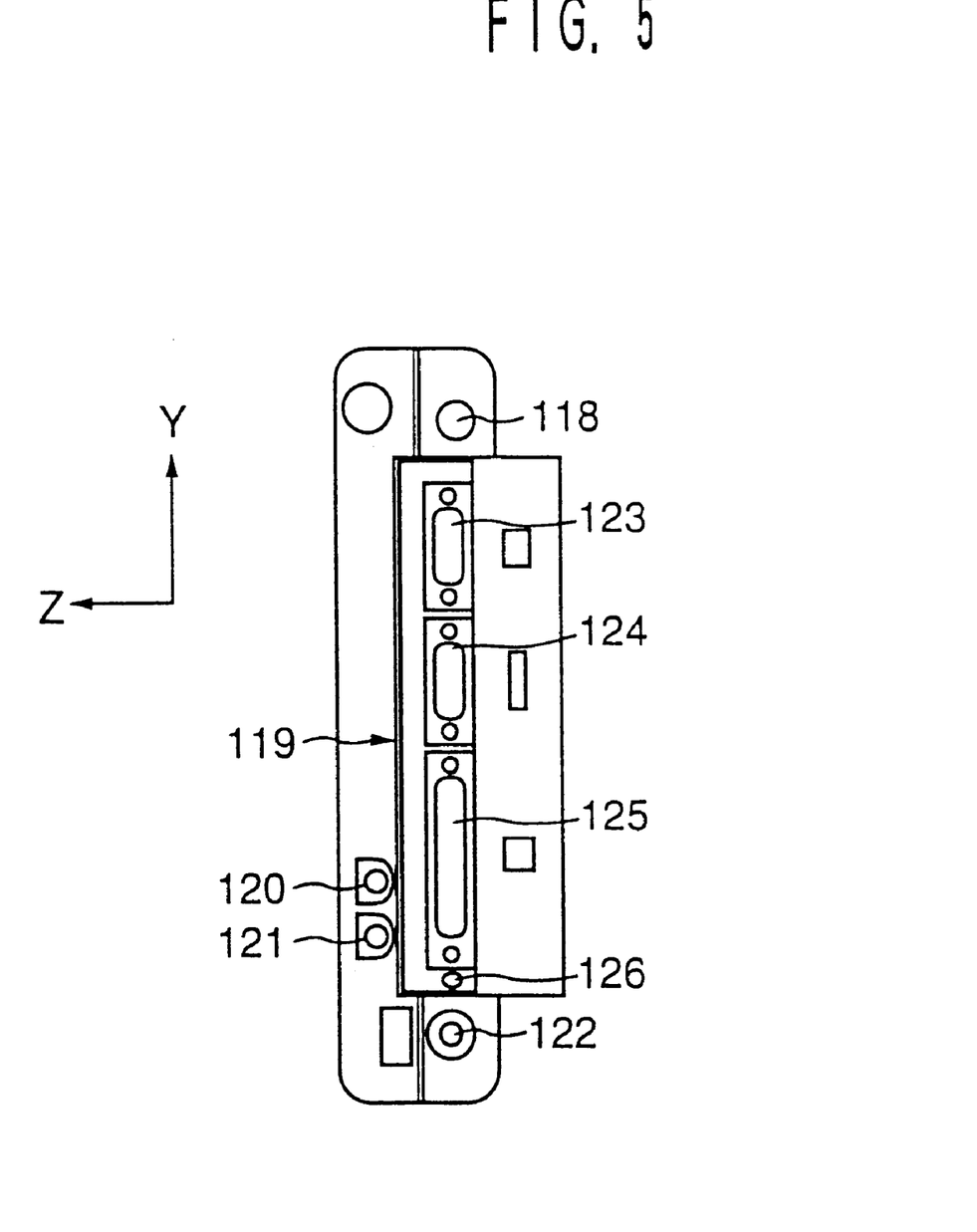
FIG. 5 is a side view of the embodiment of the present invention.

FIG. 3 is a perspective view of a display surface of an embodiment of the present invention, FIG. 4 is a perspective view of a reverse side of the embodiment of the present invention, and FIG. 5 is a side view of the embodiment of the present invention.

An electronic apparatus 100 of this embodiment is a portable computer apparatus of a pen-input type. As shown in FIG. 3, a display screen 101, a status display 102, a penholder 103, a microphone 104, a speaker 105, and a grip part 106 are provided on the front surface of the apparatus.

The display screen 101 includes a touch panel so that data can be recognized thereon and inputted thereto.

The status display 102 is provided on the upper left side of the display screen 101 to display states of the apparatus. The status display 102 displays a variety of states such as a state of access to an HDD, a state of battery charge, and a SUSPEND state.

The penholder 103 is formed on the upper right side of the display screen 101 to hold a pen for indication for a data input. The pen is extracted from the penholder 103 when the apparatus is operated. Indications are given and operations are performed with respect to the apparatus by pressing the display screen 101 by means of the pen extracted from the penholder 103.

The microphone 104 is provided on the upper right side of the display screen 101. The microphone 104 is used for inputting voice as data.

The speaker 105 is provided on the lower right side of the display screen 101. The speaker 105 is used for an audio output. The left side of the display screen 101 is designed to be the grip part 106 for the user holding the apparatus in a portable use thereof.

A PC card slot 107, a modem port 108, an IrDA port 109, and a SUSPEND/RESUME button 110 are provided on the upper surface of the apparatus.

The PC card slot 107 conforms, for instance, to PCMCIA, and an IC card conforming to PCMCIA is inserted thereinto from outside. The functions of the apparatus can be expanded by inserting the PC card.

A telephone line is connected to the modem port 108. Data communication is enabled by connecting the telephone line to the modem port 108.

The IrDA port 109 enables infrared communication conforming to IrDA (Infrared Data Association). The SUSPEND/RESUME button 110 is a press button for commanding a SUSPEND or RESUME operation. If the SUSPEND/RESUME button 110 is pressed while the apparatus is in a normal operating state, the apparatus is set in the SUSPEND state that is a power-saving mode. If the SUSPEND/RESUME button 110 is pressed while the apparatus is in the SUSPEND state or in a POWER SHUT-OFF state, the apparatus returns to the normal operating state.

Further, a USB port 111 and a battery pack attachment part 112 are provided on the left side face of the apparatus.

The USB port 111 is a port conforming to the USB (Universal Serial Bus) standard. A variety of peripheral devices conforming to the USB standard, such as a modem, a TA, a printer, a keyboard, and a mouse, are connected to the USB port 111.

A battery pack for driving the apparatus is attached to the battery pack attachment part 112.

As shown in FIG. 4, a variety of attachment coupling parts 114 are formed on the reverse side of the apparatus. An option such as a hand strap is coupled to a corresponding one of the attachment coupling parts 114.

A heat sink vent 115, a system interface port 116, and a docking contact 117 are provided on the lower surface of the apparatus. The heat sink vent 115 is a vent for emitting outside heat generated in the apparatus. The heat sink vent 115 emits the heat generated in driving the apparatus so that an optimum temperature is maintained therein.

The system interface port 116 is a connection port exclusively for the system, and a peripheral device conforming to the port is connected thereto.

The docking contact 117 is a contact for a connection with an expansion station and connects the apparatus and the expansion station.

Further, a DC-input connector 118, an I/O connector part 119, a headphone jack 120, a microphone jack 121, and a PS/2 port 122 are provided on the right side face of the apparatus.

An AC adapter is connected to the DC-input connector 118 so that a DC voltage is applied. The I/O connector part 119 has a variety of I/O connectors provided therein. A headphone is connected to the headphone jack 120, and a microphone is connected to the microphone jack 121. A keyboard or a mouse conforming to PS/2 is connected to the PS/2 port 122.

As shown in FIG. 5, a video port 123, a serial port 124, a parallel port 125, and a reset button 126 are provided in the I/O connector part 119 of the apparatus.

A display is connected to the video port 123. A connector conforming to RS232C is connected to the serial port 124 for a data input and output. The parallel port 125 is a so-called printer port, to which a parallel connector such as a printer is connected.

The reset button 126 is operated when the apparatus is activated after power is turned OFF. That is, the reset button 126 is operated to perform a so-called reset operation. Once the reset operation is performed, data in process is erased. Therefore, the reset button 126 is designed to be pressed by a pen point so as not to be operated easily. The reset button 126 is operated at a time of an abnormal operation.

Figure 6:
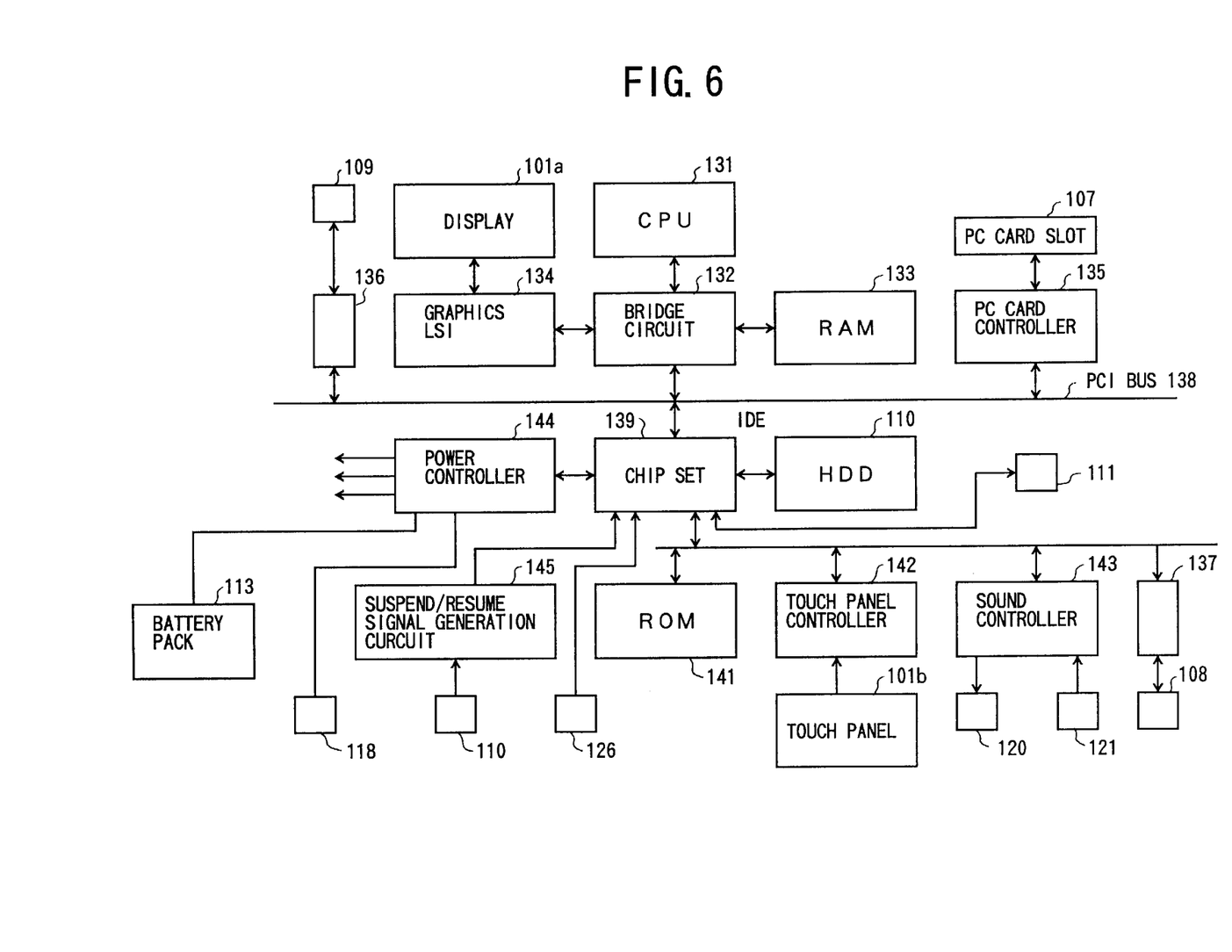
FIG. 6 is a block diagram of the embodiment of the present invention.

FIG. 6 is a block diagram of the embodiment of the present invention.

The electronic apparatus 100 includes a CPU 131, a bridge circuit 132, a RAM 133, a graphics LSI 134, a PC card controller 135, a modem 136, an IrDA controller 137, a PCI bus 138, a chip set 139, an HDD 140, a ROM 141, a touch panel controller 142, a sound controller 143, a power controller 144, a SUSPEND/RESUME signal generation circuit 145, and an ISA bus 146.

The CPU 131 performs operations in accordance with programs stored in the HDD 140.

The bridge circuit 132 is connected to the CPU 131, the RAM 133, and the PCI bus 136. The RAM 133 is employed as working storage for operations performed by the CPU 131.

The graphics LSI 134 is connected between a display 101a and the PCI bus 138 to process data to be displayed and display the data on the display 101a of the display screen 101.

The PC card controller 135 is connected between the PC card slot 107 and the PCI bus 138 to connect the PC card attached to the PC card slot 107 to the PCI bus 138. The modem 136 is connected between the modem port 109 and the PCI bus 138 to provide an interface between the PCI bus 138 and the telephone line.

The USB port 111, the reset button 126, the PCI bus 138, the HDD 140, the ROM 141, the power controller 144, the SUSPEND/RESUME signal generation circuit 145, and an ISA bus 146 are connected to the chip set 139, which provides an interface with the peripheral devices and, as will be described later, performs a variety of functions including a SUSPEND/RESUME function.

The HDD 140 stores the programs to be executed in the apparatus and data. The programs stored in the HDD 140 are read out to the RAM 133 and executed by the CPU 131 upon request.

Drive power is supplied from the battery pack 133 or the DC-input port 118 to the power controller 144. The power controller 144 generates driving power for driving parts such as the CPU 131 and the HDD 140 from the drive power supplied from the battery pack 133 or the DC input port 118, and supplies the driving power to the parts. The power controller 144 is connected to the chip set 139, and controls the SUSPEND and RESUME operations, and a POWER SHUT-OFF operation based on a control signal supplied from the chip set 139.

The SUSPEND/RESUME signal generation circuit 145 is connected between the SUSPEND/RESUME button 110 and the chip set 139 to generate a SUSPEND/RESUME signal based on an operation of the SUSPEND/RESUME button 110. As will be described later, the SUSPEND/RESUME signal generation circuit 145 generates the SUSPEND/RESUME signal so as to set a LOW-level period thereof shorter than a predetermined period of time.

Further, the reset button 126 is connected to the chip set 139. If the reset button 126 is operated, the chip set 139 supplies a command for the POWER SHUT-OFF operation to the power controller 144, and after the power is shut off, the chip set 139 controls the power controller 144 to turn on the power again to activate the apparatus.

The IrDA controller 137, the ROM 141, the touch panel controller 142, and the sound controller 143 are connected to the ISA bus 146.

The IrDA controller 137 is connected between the IrDA port 108 and the ISA bus 146 so as to provide an interface between a signal transmitted or received by means of infrared by the IrDA port 108, and the PCI bus 138.

The ROM 141 stores a boot program. The boot program stored in the ROM 141 is executed by the CPU 131 at a time of the reset operation or at a time of turning on the power so as to set the apparatus in an enabled state.

The touch panel controller 142 is connected between a touch panel 101b forming the display screen 101 together with the display 101a, and the ISA bus 146 so as to provide an interface therebetween.

The sound controller 143 is connected between the ISA bus, and the headphone and microphone Jacks 120 and 121 to perform speech processing.

The USB port 111 is connected to the chip set 139 so that communication is made with the peripheral devices connected to the USB port 111.

Next, a detailed description will be given of the SUSPEND/RESUME signal generation circuit 145.

Figure 7:
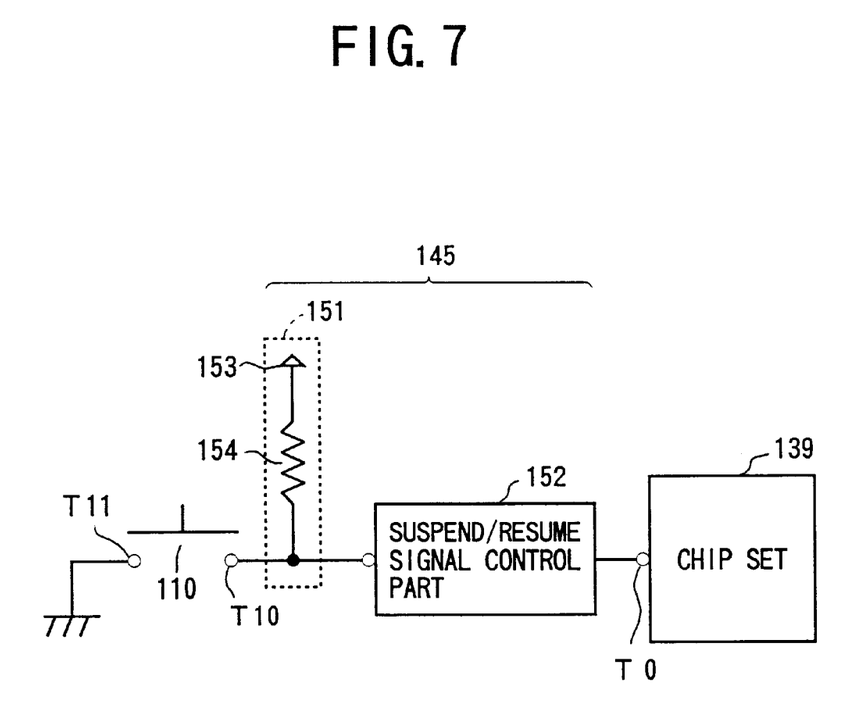
FIG. 7 is a block diagram of a SUSPEND/RESUME signal generation circuit of the embodiment of the present invention.

FIG. 7 is a block diagram of the SUSPEND/RESUME signal generation circuit of the embodiment of the present invention.

The SUSPEND/RESUME signal generation circuit 145 of this embodiment includes a SUSPEND/RESUME signal generation part 151 and a SUSPEND/RESUME signal control part 152.

The SUSPEND/RESUME signal generation part 151 includes a constant voltage source 153 and a resistor 154. A constant voltage supplied from the constant voltage source 153 is reduced through the resistor 154 to be applied to one end T10 of the SUSPEND/RESUME button 110. The SUSPEND/RESUME button 110 has its one end T10 connected to the SUSPEND/RESUME signal generation part 151 and is connected to a SUSPEND/RESUME control terminal T0 of the chip set 139 via the SUSPEND/RESUME signal control part 152. The other end T11 of the SUSPEND/RESUME button 110 is grounded. The SUSPEND/RESUME button 110 has its both ends T10 and T11 opened in a normal state, and short-circuited in a pressed state.

Therefore, in the normal state in which the SUSPEND/RESUME button 110 is not operated, the constant voltage supplied from the SUSPEND/RESUME signal generation part 151 is applied to the SUSPEND/RESUME signal control part 152. That is, the input of the SUSPEND/RESUME signal control part 152 is set to a HIGH level. On the other hand, if the SUSPEND/RESUME button 110 is pressed, both ends T10 and T11 of the SUSPEND/RESUME button 110 are short-circuited, so that the constant voltage generated in the SUSPEND/RESUME signal generation part 151 is applied to a ground. That is, the input of the SUSPEND/RESUME signal control part is set to a LOW level.

The SUSPEND/RESUME signal control part 152 restricts the LOW-level state period of the input to less than a predetermined period of time.

Figure 8:
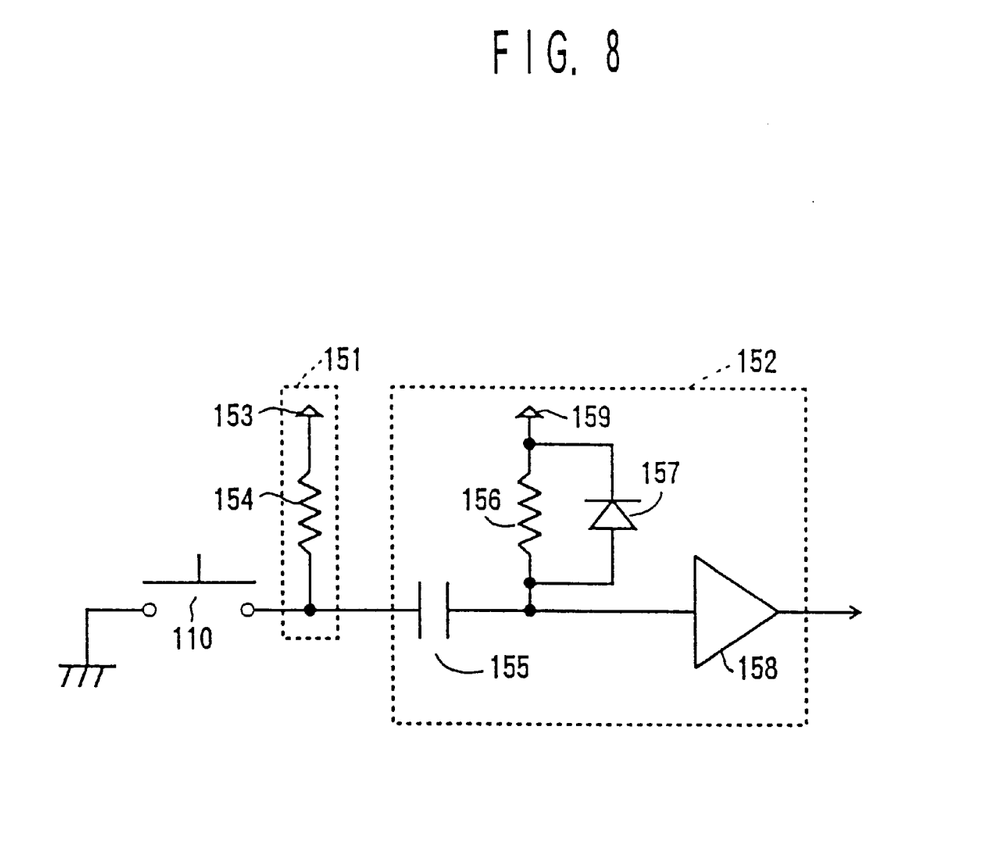
FIG. 8 is a circuit diagram of a SUSPEND/RESUME signal control part of the embodiment of the present invention.

FIG. 8 is a circuit diagram of the SUSPEND/RESUME signal control part of the embodiment of the present invention.

The SUSPEND/RESUME signal control part 152 includes a capacitor 155, a resistor 156, a diode 157, and an amplifier circuit 158.

The capacitor 155 has a first end connected to the connection point of the SUSPEND/RESUME button 110 and the SUSPEND/RESUME signal generation part 151. The capacitor 155 generates a differentiated waveform of the signal at the connection point of the SUSPEND/RESUME button 110 and the SUSPEND/RESUME signal generation part 151.

The capacitor 155 has a second end connected to the amplifier circuit 158. The amplifier circuit 158 is supplied with the differentiated waveform of the SUSPEND/RESUME signal, and outputs a signal whose level becomes LOW when the level of the differentiated waveform is below a predetermined level, and becomes HIGH when the level of the differentiated waveform is above the predetermined level.

The resistor 156 restricts a current supplied from a power supply 159. The current supplied from the resistor 156 is supplied to the connection point of the capacitor 155 and the amplifier circuit 158 as a charging current of the capacitor 155. If the voltage of the connection point of the capacitor 155 and the amplifier circuit 158 exceeds an upper limit, the diode 157 is forward-biased to keep constant the voltage of the connection point of the capacitor 155 and the amplifier circuit 158.

Figure 9:
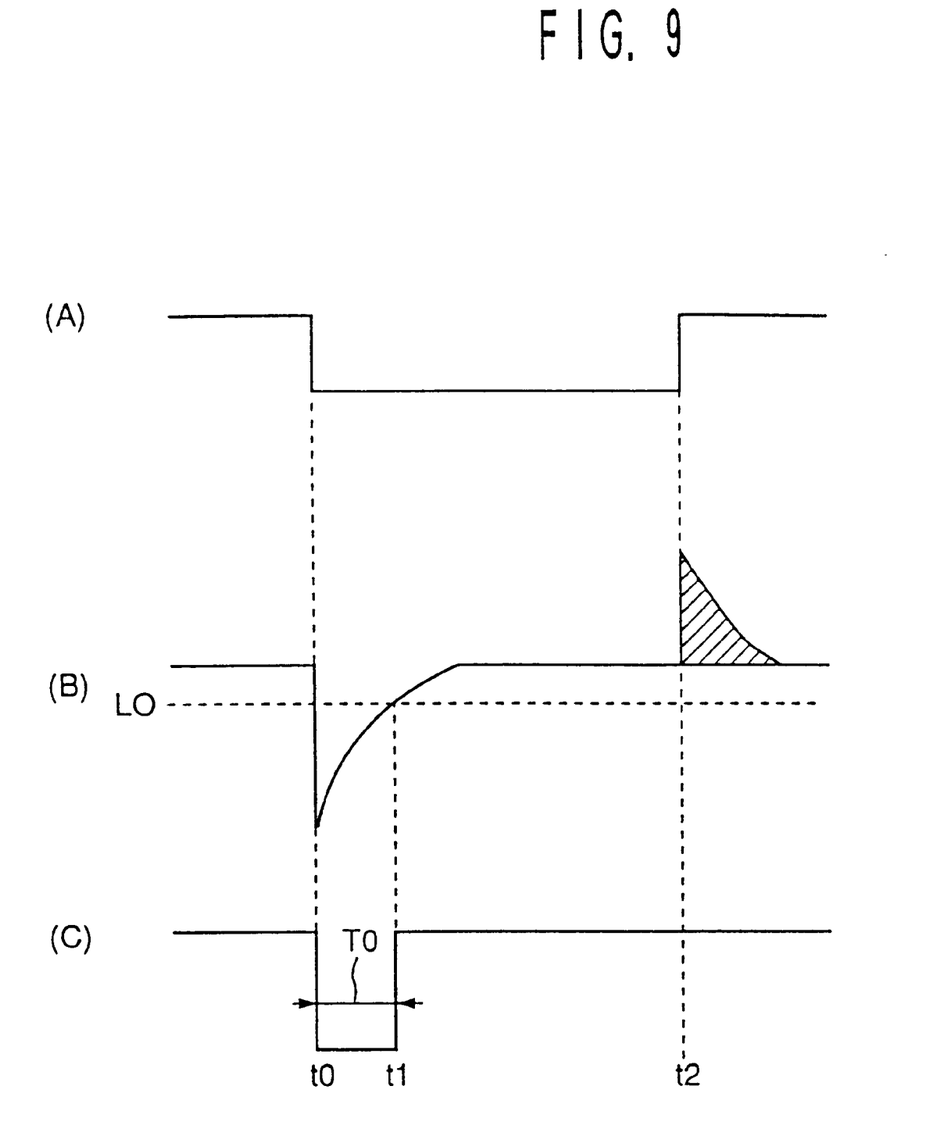
FIG. 9 is a waveform chart of an operation of the SUSPEND/RESUME signal control part of the embodiment of the present invention.

FIG. 9 is a waveform chart of an operation of the SUSPEND/RESUME signal control part of the embodiment of the present invention. FIG. 9(A) is a waveform of the SUSPEND/RESUME signal supplied to the SUSPEND/RESUME signal control part 152, FIG. 9(B) is a waveform obtained by differentiating the supplied waveform by the capacitor 155, and FIG. 9(C) is an output waveform of the SUSPEND/RESUME signal control part 152.

When the SUSPEND/RESUME button 110 is pressed ON at a time t0, the SUSPEND/RESUME signal is reversed from a HIGH level to a LOW level as shown in FIG. 9(A).

When the SUSPEND/RESUME signal is reversed from the HIGH level to the LOW level as shown in FIG. 9(A), the capacitor 155 discharges, so that the level of the second end of the capacitor 155 becomes LOW as shown in FIG. 9(B). When the level of the second end of the capacitor 155 becomes LOW, the amplifier circuit 157 is switched OFF so that the output level of the amplifier circuit 158 becomes LOW as shown in FIG. 9(C).

When the capacitor discharges and the level of the second end of the capacitor 155 becomes LOW as shown in FIG. 9(B), the capacitor 155 is gradually charged by the current supplied from the resistor 156 to the second end of the capacitor 155 so that the level of the second end of the capacitor 155 gradually increases.

Next, when the capacitor 155 is gradually charged so as to reach a predetermined level L0 at a time t1 as shown in FIG. 9(B), the amplifier circuit 158 is switched ON so that the output level thereof becomes HIGH as shown in FIG. 9(C).

Next, when the SUSPEND/RESUME button 110 is released at a timing t2, the level of the signal supplied to the first end of the capacitor 155 of the SUSPEND/RESUME signal control part 152 becomes HIGH as shown in FIG. 9(A).

When the level of the first end of the capacitor 155 becomes HIGH, the capacitor 155 is charged so that the level of the second end thereof also attempts to become HIGH. However, the capacitor 155 is bypassed by the diode 157 to be maintained at a certain level determined by the power supply 159 and the resistor 156. That is, a protruding part indicated by oblique hatching in FIG. 9(B) is restricted so that the output of the amplifier circuit 158 is not affected.

In this case, a LOW-level period T0 shown in FIG. 9(C) is set to a predetermined period by a time constant determined by a capacity of the capacitor 155 and a value of the resistor 156. The capacity of the capacitor 155 and the value of the resistor 156 are provided so that the LOW-level period T0 is set to be shorter than a period during which the chip set 139 does not command the POWER SHUT-OFF operation, that is, a period of four seconds.

Therefore, even if the SUSPEND/RESUME button 110 is kept pressed for four seconds or longer, the signal supplied to the chip set 139 is reversed from the LOW level to the HIGH level when the predetermined period set by the time constant determined by the capacity of the capacitor 155 and the value of the resistor 156 passes since the SUSPEND/RESUME button 110 is pressed. Thus, the SUSPEND/RESUME button 110 is prevented from shutting off the power of the apparatus.

Therefore, even if the user unintentionally operates the SUSPEND/RESUME button 110 for four consecutive seconds or longer to perform the SUSPEND or RESUME operation, the POWER SHUT-OFF is prevented from being caused.

A circuit that prevents the SUSPEND/RESUME signal from being maintained at the LOW-level for four consecutive seconds or longer is not limited to the one having the above-described structure. Further, the above-described circuit structure can be realized, without an additional circuit, by providing the SUSPEND/RESUME button 110 with a structure that prevents the contacts of the SUSPEND/RESUME button 110 from being in contact for four seconds or longer in a single operation.

Thus, according to the electronic apparatus of this embodiment, which apparatus generates a detection signal based on an operation of an operation means, operates a SUSPEND function based on a state change of the generated detection signal, and shuts off the power when a certain state of the detection signal continues for a predetermined period, a period of the certain state of the generated detection signal is restricted within the predetermined period.

Further, according to this embodiment, a differentiated waveform of the detection signal generated by a detection signal generation means is generated so that a binary signal is generated based on the level of the generated differentiated waveform.

Moreover, the electronic apparatus is characterized by including a limiter that restricts the differentiated waveform of the detection signal generated by a differentiating means to a predetermined level.

According to this embodiment, by restricting the period of the certain state of the detection signal within the predetermined period, the period of the detection signal is restricted within the predetermined period even if a SUSPEND/RESUME button is pressed for the predetermined period or longer. Therefore, even if the SUSPEND/RESUME button is unintentionally pressed for a longer period than necessary, the power is precluded from being shut off, thus preventing the loss of data.

Further, according to the present invention, by restricting the differentiated waveform of the detection signal to the predetermined level, an amplifier circuit is provided with a signal whose level is equal to or below the predetermined level, thus preventing a malfunction of the apparatus.

As described above, according to this embodiment, by restricting the period of a predetermined input operation by an input means within the predetermined period, the state of the apparatus is prevented from being changed from the first state to the third state even if the input means is operated for the predetermined period or longer. Therefore, an unnecessary state transition can be prevented, thus increasing the operability of the electronic apparatus.

What is claimed is:

1. An electronic apparatus changing states thereof based on a predetermined input operation, comprising:

an input part performing the predetermined input operation;

an input operation detection part detecting a presence or absence of the predetermined input operation of said input part;

a state transition control part changing a state of the apparatus from a first state to a second state when said input operation detection part detects the predetermined input operation of said input part, the first and second states being different from each other; and a nullification part automatically nullifying the predetermined input operation of said input part so as to prevent the second state of the apparatus from being changed once the predetermined input operation of said input part continues for a predetermined time period.

2. The electronic apparatus as claimed in claim 1, wherein:

said input operation detection part comprises a detection signal generation part generating a detection signal of a certain state based on the predetermined input operation of said input part; and said nullification part comprises a detection signal restriction part restricting a time period of the certain state of the detection signal to a value less than the predetermined time period.

3. The electronic apparatus as claimed in claim 1, wherein said nullification part includes a capacitor and a resistor, and automatically nullifies the predetermined input operation of said input part based on a time constant determined by a capacity of the capacitor and a value of the resistor.

4. The electronic apparatus as claimed in claim 1, wherein:

said input part comprises first and second input parts;

said transition control part changes the state of the apparatus from the first state to the second state when said input operation detection part detects the predetermined input operation by the first input part, and from the first state to a third state when said input operation detection part detects the predetermined input operation of the second input part, the third state being different from the first and second states; and said nullification part automatically nullifying the predetermined input operation of the first input part once the predetermined input operation of the first input part continues for the predetermined time period.

5. A control circuit of an electronic apparatus including an input part commanding a transition of states of the apparatus, an input operation detection part detecting a presence or absence of a predetermined input operation by said input part, a state transition control part changing a state of the apparatus from a first state to a second state when said input operation detection part detects the predetermined input operation of said input part, the first and second states being different from each other, said control circuit comprising:

a nullification part automatically nullifying the predetermined input operation of said input part so as to prevent the second state of the apparatus from being changed once the predetermined input operation of said input part continues for a predetermined time period.

6. The control circuit as claimed in claim 5, wherein:

said input operation detection part comprises a detection signal generation part generating a detection signal of a certain state based on the predetermined input operation of said input part; and said nullification part comprises a detection signal restriction part restricting a time period of the certain state of the detection signal to a value less than the predetermined time period.

7. The control circuit as claimed in claim 5, wherein said nullification part includes a capacitor and a resistor, and automatically nullifies the predetermined input operation of said input part based on a time constant determined by a capacity of the capacitor and a value of the resistor.

8. The control circuit as claimed in claim 5, wherein:

said input part comprises first and second input parts;

said transition control part changes the state of the apparatus from the first state to the second state when said input operation detection part detects the predetermined input operation by the first input part, and from the first state to a third state when said input operation detection part detects the predetermined input operation of the second input part, the third state being different from the first and second states; and said nullification part automatically nullifying the predetermined input operation of the first input part once the predetermined input operation of the first input part continues for the predetermined time period.

9. A method of controlling an electronic apparatus changing states thereof based on a predetermined input operation, comprising the steps of:

(a) detecting a presence or absence of the predetermined input operation;

(b) changing a state of the apparatus from a first state to a second state when the predetermined input operation is detected in said step a, the first and second states being different from each other; and (c) automatically nullifying the predetermined input operation so as to prevent the second state of the apparatus from being changed once the predetermined input operation continues for a predetermined time period.

10. The method as claimed in claim wherein said step (c) automatically nullifies the predetermined input operation based on a time constant determined by a capacity of a capacitor and a value of a resistor.

11. The method as claimed in claim 9, further comprising the step of (d) changing the state of the apparatus from the first state to a third state different from the first and second states, wherein:

the predetermined input operation comprises first and second input operations;

said step (b) changes the state of the apparatus from the first state to the second state when said step (a) detects the first input operation;

said step (d) changes the state of the apparatus from the first state to the third state when said step (a) detects the second input operation; and said step (c) automatically nullifies the predetermined input operation once the predetermined input operation continues for the predetermined time period only when the predetermined input operation is the first input operation.

12. An electronic apparatus changing states thereof based on a predetermined input operation, comprising:

an input part performing the predetermined input operation;

an input operation detection part detecting a presence or absence of the predetermined input operation of said input part;

a state of transition control part changing a state of the apparatus from a first state to a second state when said input operation detection part detects the predetermined input operation of said input part, the first and second states being different from each other; and a nullification part automatically nullifying the predetermined input operation of said input part once the predetermined input operation of said input part continues for a predetermined time period, wherein said input part comprises first and second input parts;

said transition control part changes the state of the apparatus from the first state to the second state when said input operation detection part detects the predetermined input operation by the first input part, and from the first state to a third state when said input operation detection part detects the predetermined input operation of the second input part, the third state being different from the first and second states; and said nullification part automatically nullifying the predetermined input operation of the first input part once the predetermined input operation of the first input part continues for the predetermined time period.

13. A control circuit of an electronic apparatus including an input part commanding a transition of states of the apparatus, an input operation detection part detecting a presence or absence of a predetermined input operation by said input part, a state transition control part changing a state of the apparatus from a first state to a second state when said input operation detection part detects the predetermined input operation of said input part, the first and second states being different from each other, said control circuit comprising:

a nullification part automatically nullifying the predetermined input operation of said input part once the predetermined input operation of said input part continues for a predetermined time period, wherein said input part comprises first and second input parts;

said transition control part changes the state of the apparatus from the first state to the second state when said input operation detection part detects the predetermined input operation by the first input part, and from the first state to a third state when said input operation detection part detects the predetermined input operation of the second input part, the third state being different from the first and second states; and said nullification part automatically nullifying the predetermined input operation of the first input part once the predetermined input operation of the first input part continues for the predetermined time period.

14. A method of controlling an electronic apparatus changing states thereof based on a predetermined input operation, comprising the steps of:

(a) detecting a presence or absence of the predetermined input operation;

(b) changing a state of the apparatus from a first state to a second state when the predetermined input operation is detected in said step (a), the first and second states being different from each other; and (c) automatically nullifying the predetermined input operation once the predetermined input operation continues for a predetermined time period, wherein further comprising the step of(d) changing the state of the apparatus from the first state to a third state different from the first and second states, wherein the predetermined input operation comprises first and second input operations;

said step (b) changes the state of the apparatus from the first state to the second state when said step (a) detects the first input operation;

said step (d) changes the state of the apparatus from the first state to the third state when said step (a) detects the second input operation; and said step (c) automatically nullifies the predetermined input operation once the predetermined input operation continues for the predetermined time period only when the predetermined input operation is the first input operation.

* * * * *